United States Patent
Modha

(10) Patent No.: US 9,563,842 B2
(45) Date of Patent: Feb. 7, 2017

(54) STRUCTURAL PLASTICITY IN SPIKING NEURAL NETWORKS WITH SYMMETRIC DUAL OF AN ELECTRONIC NEURON

(71) Applicant: International Business Machines Corporation, Armonk, NY (US)

(72) Inventor: Dharmendra S. Modha, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/823,892

(22) Filed: Aug. 11, 2015

(65) Prior Publication Data

US 2015/0347897 A1 Dec. 3, 2015

Related U.S. Application Data

(63) Continuation of application No. 13/570,087, filed on Aug. 8, 2012, now Pat. No. 9,183,495, which is a
(Continued)

(51) Int. Cl.
*G06F 15/18* (2006.01)
*G06N 3/08* (2006.01)
(Continued)

(52) U.S. Cl.
CPC ........ *G06N 3/08* (2013.01); *G06N 3/04* (2013.01); *G06N 3/049* (2013.01); *G06N 3/061* (2013.01);
(Continued)

(58) Field of Classification Search
None
See application file for complete search history.

(56) References Cited

U.S. PATENT DOCUMENTS 5,214,743 A * 5/1993 Asai .................. G06N 3/063
706/31
5,577,028 A * 11/1996 Chugo .................. H04L 45/08
370/409
(Continued)

OTHER PUBLICATIONS

Razvan Florian, "Reinforcement Learning Through Modulation of Spike-Timing-Dependent Synaptic Plasticity", 2007, Nueral Computation, 19, pp. 1469-1502.*
(Continued)

*Primary Examiner* — Paulinho E Smith
(74) *Attorney, Agent, or Firm* — Sherman IP LLP; Kenneth L. Sherman; Hemavathy Perumal

(57) ABSTRACT

A neural system comprises multiple neurons interconnected via synapse devices. Each neuron integrates input signals arriving on its dendrite, generates a spike in response to the integrated input signals exceeding a threshold, and sends the spike to the interconnected neurons via its axon. The system further includes multiple noruens, each noruen is interconnected via the interconnect network with those neurons that the noruen's corresponding neuron sends its axon to. Each noruen integrates input spikes from connected spiking neurons and generates a spike in response to the integrated input spikes exceeding a threshold. There can be one noruen for every corresponding neuron. For a first neuron connected via its axon via a synapse to dendrite of a second neuron, a noruen corresponding to the second neuron is connected via its axon through the same synapse to dendrite of the noruen corresponding to the first neuron.

20 Claims, 9 Drawing Sheets

Related U.S. Application Data continuation of application No. 13/149,733, filed on May 31, 2011, now Pat. No. 8,712,940.

(51) Int. Cl.
*G06N 3/06* (2006.01)
*G06N 3/04* (2006.01)
*G06N 3/063* (2006.01)
*G11C 11/54* (2006.01)

(52) U.S. Cl.
CPC ............ *G06N 3/063* (2013.01); *G06N 3/0635* (2013.01); *G11C 11/54* (2013.01); *Y10T 428/2481* (2015.01)

(56) References Cited

U.S. PATENT DOCUMENTS

| | | | |
|---|---|---|---|
| 5,581,660 A | 12/1996 | Horan | |
| 5,592,589 A * | 1/1997 | Poon | G06N 3/04 706/25 |
| 5,680,514 A | 10/1997 | Shams | |
| 6,502,083 B1 * | 12/2002 | Louis | G06K 9/6276 706/15 |
| 7,174,325 B1 | 2/2007 | Ascoli | |
| 7,398,259 B2 * | 7/2008 | Nugent | G06N 3/08 706/15 |
| 7,672,918 B2 | 3/2010 | Adkins | |
| 8,027,942 B2 | 9/2011 | De Tremiolles et al. | |
| 8,812,414 B2 * | 8/2014 | Arthur | G11C 11/54 706/15 |
| 8,843,425 B2 | 9/2014 | Modha | |
| 8,909,576 B2 | 12/2014 | Akopyan et al. | |
| 2003/0208451 A1 | 11/2003 | Liaw | |
| 2006/0184465 A1 * | 8/2006 | Tsujino | G06N 3/049 706/15 |
| 2008/0162391 A1 * | 7/2008 | Izhikevich | G06N 3/049 706/25 |
| 2009/0292661 A1 * | 11/2009 | Haas | G06N 3/0635 706/33 |
| 2010/0076916 A1 * | 3/2010 | van der Made | G06N 3/063 706/27 |
| 2011/0119215 A1 * | 5/2011 | Elmegreen | G06N 3/063 706/37 |
| 2012/0109864 A1 * | 5/2012 | Modha | G06N 3/063 706/25 |
| 2013/0073080 A1 * | 3/2013 | Ponulak | G05B 13/0265 700/246 |
| 2013/0159231 A1 | 6/2013 | Modha | |
| 2013/0297541 A1 | 11/2013 | Piekniewski et al. | |
| 2014/0019393 A1 | 1/2014 | Modha | |
| 2014/0081895 A1 * | 3/2014 | Coenen | G05B 13/027 706/25 |
| 2014/0258194 A1 | 9/2014 | Towal et al. | |
| 2014/0279778 A1 | 9/2014 | Lazar et al. | |
| 2014/0310220 A1 * | 10/2014 | Chang | G06N 3/063 706/25 |
| 2014/0351190 A1 | 11/2014 | Levin et al. | |

OTHER PUBLICATIONS

Paugam-Moisy, H. et al., Computing With Spiking Neuron Networks, Handbook of Natural Computing, Sep. 2009, pp. 1-47, Springer-Veriag, Germany.

Mattia, M., et al., Efficient Event-Driven Simulation of Large Networks of Spiking Neuronsand Dynamical Synapses, Neural Networks, 2000, pp. 2305-2329, MIT, United States.

Paugam-Moisy, H. et al., A Supervised Learning Approach Based on STDP and Polychronization in Spiking Neuron Networks, European Symposium on Artificial Neural Networks, Apr. 2007, pp. 427-432, Bruges, Belgium.

U.S. Notice of Allowance for U.S. Appl. No. 13/149,733 mailed Dec. 16, 2013.

U.S. Notice of Allowance for U.S. Appl. No. 13/570,087 mailed Jul. 6, 2015.

U.S. Notice of Allowance for U.S. Appl. No. 14/223,886 mailed Jul. 6, 2015.

\* cited by examiner

STRUCTURAL PLASTICITY IN SPIKING NEURAL NETWORKS WITH SYMMETRIC DUAL OF AN ELECTRONIC NEURON

This invention was made with Government support under HR0011-09-C-0002 awarded by Defense Advanced Research Projects Agency (DARPA). The Government has certain rights in this invention.

BACKGROUND

The present invention relates to neuromorphic and synaptronic systems, and in particular, structural plasticity for neural networks.

Neuromorphic and synaptronic systems, also referred to as artificial neural networks, are computational systems that permit electronic systems to essentially function in a manner analogous to that of biological brains. Neuromorphic and synaptronic systems do not generally utilize the traditional digital model of manipulating 0s and 1s. Instead, neuromorphic and synaptronic systems create connections between processing elements that are roughly functionally equivalent to neurons of a biological brain. Neuromorphic and synaptronic systems may comprise various electronic circuits that are modeled on biological neurons.

In biological systems, the point of contact between an axon of a neuron and a dendrite on another neuron is called a synapse, and with respect to the synapse, the two neurons are respectively called pre-synaptic and post-synaptic. The essence of our individual experiences is stored in conductance of the synapses. The synaptic conductance changes with time as a function of the relative spike times of pre-synaptic and post-synaptic neurons, as per spike-timing dependent plasticity (STDP). The STDP rule increases the conductance of a synapse if its post-synaptic neuron fires after its pre-synaptic neuron fires, and decreases the conductance of a synapse if the order of the two firings is reversed.

BRIEF SUMMARY

Embodiments of structural plasticity in spiking neural networks with symmetric dual of an electronic neuron are provided herein. In one embodiment, the invention provides a neural system comprising multiple neuron devices interconnected via an interconnect network comprising a plurality of synapse devices. Each neuron integrates input signals arriving on its dendrite, generates a spike signal in response to the integrated input signals exceeding a threshold, and sends the spike signal to the interconnected neurons via its axon. The system further comprises multiple noruen devices corresponding to the neurons, each noruen comprising a symmetric dual of a neuron. Each noruen is interconnected via the interconnect network with those neurons that the noruen's corresponding neuron sends its axon to. Each noruen integrates input spike signals from connected spiking neurons and generates a spiking signal in response to the integrated input spike signals exceeding a threshold.

In another embodiment the present invention provides a neural system comprising a neuron network of multiple neuron devices interconnected via a forward interconnect network including a plurality of synapses. Each neuron integrates input signals arriving on its dendrite, generates a spike signal in response to the integrated input signals exceeding a threshold, and sends the spike signal to the interconnected neurons via its axon. The system further comprises a noruen network of multiple noruen devices connected to the neuron network via the interconnect network, one noruen for every corresponding neuron, wherein each noruen comprises a symmetric dual of a neuron. For a first neuron that is connected via its axon through a synapse to dendrite of a second neuron, a noruen corresponding to the second neuron is connected via its axon through the same synapse to dendrite of the noruen corresponding to the first neuron. Each noruen integrating input spike signals from connected spiking neurons and generating a spiking signal in response to the integrated input spike signals exceeding a threshold.

These and other features, aspects and advantages of the present invention will become understood with reference to the following description, appended claims and accompanying figures.

DETAILED DESCRIPTION

Figure 1A:
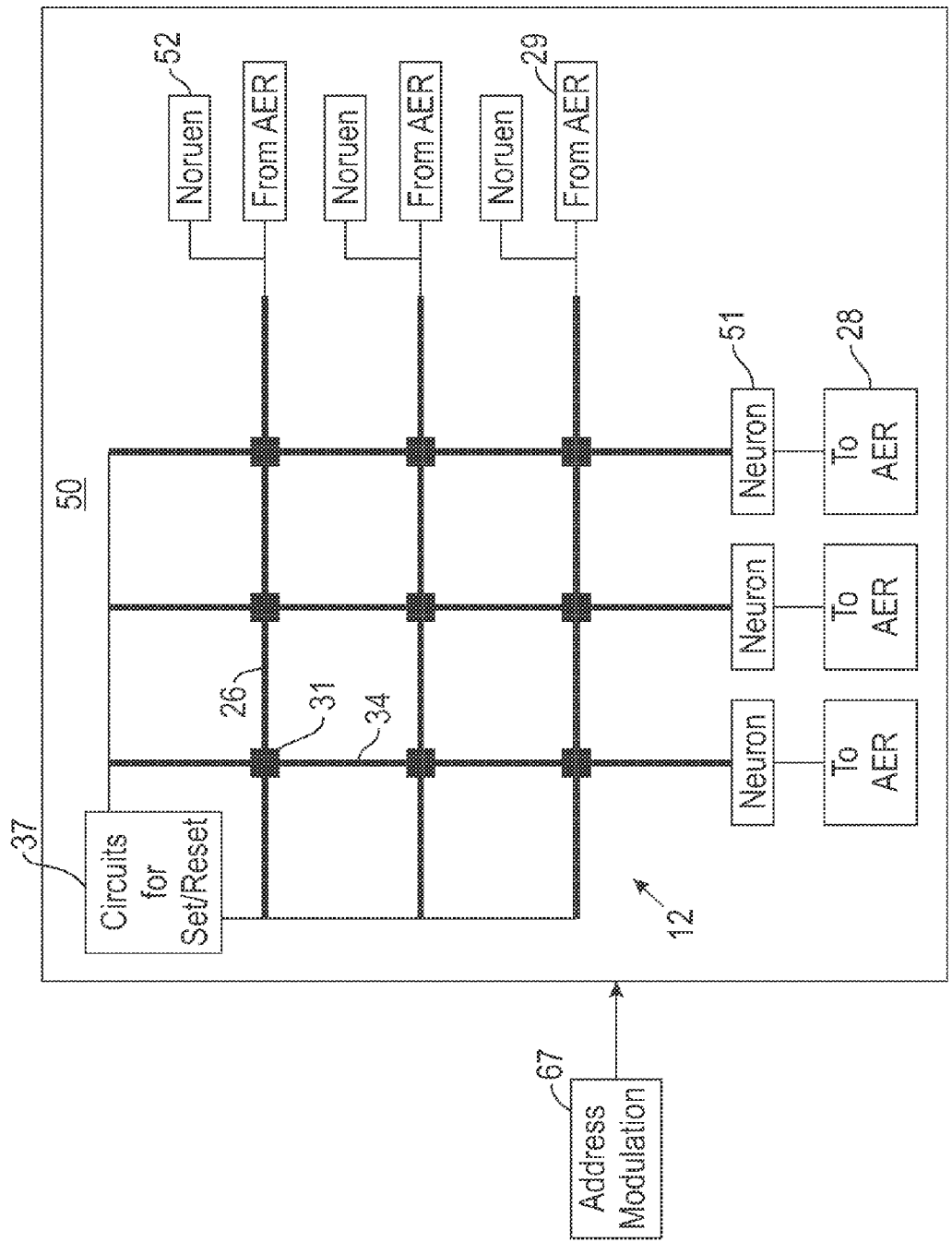
FIG. 1A shows a block diagram of a spiking neural network with structural plasticity including electronic neurons and symmetric duals of electronic neurons, according to an embodiment of the invention.

Embodiments of the invention provide structural plasticity in spiking neural networks including electronic neurons and symmetric duals of electronic neurons.

In one embodiment, the invention provides a neural system comprising multiple neuron devices interconnected via an interconnect network comprising a plurality of synapse devices. Each neuron integrates input signals arriving on its dendrite, generates a spike signal in response to the integrated input signals exceeding a threshold, and sends the spike signal to the interconnected neurons via its axon. The system further comprises multiple noruen devices corresponding to the neurons, each noruen comprising a symmetric dual of a neuron. Each noruen is interconnected via the interconnect network with those neurons that the noruen's corresponding neuron sends its axon to. Each noruen integrates input spike signals from connected spiking neurons and generates a spiking signal in response to the integrated input spike signals exceeding a threshold.

Each noruen implements the same spiking dynamics as its corresponding neuron. An address modulator that modulates the interconnect network to enable forward flow of information by routing said spike signals from the spiking neurons to the neurons on their axons, and enables backward flow of information by routing said spike signals from the spiking neurons to the noruens.

In one embodiment, the interconnect network comprises a crossbar of a plurality of axons and a plurality of dendrites such that the axons and dendrites are orthogonal to one another, wherein each synapse device is at a cross-point junction of the crossbar coupled between a dendrite and an axon.

In one embodiment, a pre-synaptic noruen receives input signals via backward signaling on dendrites of spiking post-synaptic neurons connected with the axon of a neuron corresponding to the noruen. A post-synaptic neuron receives input signals via forward signaling axons of connected pre-synaptic neurons.

In one embodiment, each synapse device comprises a symmetric synapse device that enables reading and updating synapse weights along axons and dendrites. Each synapse device has a synaptic weight that affects the functional behavior of the synapse device.

In another embodiment, an interface module selectively updates synaptic weights for reinforcement learning based on reinforcement signals. In response to a spike signal from a spiking neuron due to a positive event, the interface module updates synaptic weight of a connecting synapse device based on a first learning rule. Further, in response to a spike signal from a spiking neuron due to a negative event, the interface module updates synaptic weight of a connecting synapse device based on a second learning rule.

In one embodiment, if a neuron and its corresponding noruen repeatedly fire together, then the axon of said neuron is effectively utilized such that axon of the neuron remains connected in the interconnect network. If a neuron and its corresponding noruen repeatedly do not fire together, then the axon of the neuron is ineffectively utilized such that interconnection of the axon of the neuron is switched in the interconnect network.

Referring now to FIG. 1A, an embodiment of a spiking neural network 50 according to an embodiment of the invention comprises a crossbar 12 interconnecting digital electronic neurons 51.

The crossbar 12 comprises axon paths/wires (axons) 26, dendrite paths/wires (dendrites) 34, and synapse devices (synapses) 31 at cross-point junctions of each axon 26 and each dendrite 34. As such, each connection between an axon 26 and a dendrite 34 is made through a digital synapse 31. The junctions where the synapses 31 located are referred to herein as cross-point junctions. In one example, the crossbar 12 may have a pitch in the range of about 0.1 nm to 10 µm. Circuits 37 for Set/Reset are peripheral electronics that are used to load learned synaptic weights into the chip.

In general, in accordance with an embodiment of the invention, dendritic neurons will "fire" (i.e., spike by transmitting a pulse) in response to the inputs they receive from axonal input connections exceeding a threshold. Axonal neurons will "fire" (i.e., spike by transmitting a pulse) in response to the inputs they receive from dendritic input connections exceeding a threshold. Thus, axonal neurons will function as dendritic neurons in response to receiving inputs along their dendritic connections. Likewise, dendritic neurons will function as axonal neurons when sending signals out along their axonal connections. When any of the dendritic and axonal neurons fire, they will send a pulse out to their axonal and to their dendritic connections.

Figure 1B:
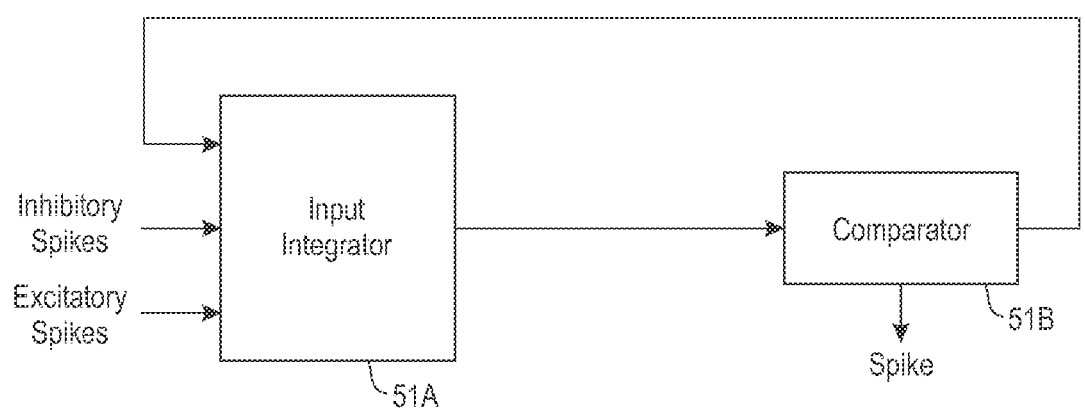
FIG. 1B shows a block diagram of an electronic neuron, in accordance with an embodiment of the invention.

FIG. 1B shows a block diagram of an electronic neuron 51, in accordance with an embodiment of the invention. Each neuron 51 has operational/functional dynamics and characteristics. As an example of such dynamics, for each excitatory spike received by neuron 51, an input integrator module 51A increases a membrane potential V of the neuron by a certain amount s+, while for each inhibitory spike the neuron receives the input integrator module 81 decreases V by a certain amount s−. A digital clock signal provides time steps. According to a comparator module 51B, if input to the neuron 80 increases V above a voltage threshold θ, a spike is generated (and V may be set to a reset value $V_{reset}$).

The network 50 further includes digital devices 52 termed "noruens. In the description herein, a noruen 52 is symmetric dual of an electronic neuron 51, with the same diagram as that in FIG. 1B for a neuron 51. Each noruen 52 has the same operational/functional dynamics and characteristics as a neuron 51. A neuron 51 receives inputs via its dendrites and projects outputs via its axons. A noruen 52 is a logical device and is a symmetric dual of a neuron 51. Noruens 52 receive inputs via axons of connected neurons 51, and the noruens 52 project outputs via dendrites of the connected neurons 51.

In one embodiment, soft-wiring in the network 50 is implemented using address events which are non-deterministic (e.g., Address-Event Representation (AER)). In the network 50, "To AER" element modules 28 and "From AER" element modules 29 facilitate communications between multiple networks 50. In the network 50, spikes arrive via "From AER" interface modules 29, and propagate via axons 26 to dendrites 34 of the neurons 51. Neurons 51 fire when they receive (i.e., in response to receiving) sufficient inputs and send spikes to axonal targets via "To AER" modules 28. Neurons 51 send signals back to all noruens 52 on the dendrites 34, wherein noruens 52 fire when they receive (i.e., in response to receiving) sufficient inputs.

Soft-wiring in the network 50 is implemented using address events which are non-deterministic as in AER. In the network 50, "To AER" element modules 28 and "From AER" element modules 29 facilitate communications between multiple networks 50 as illustrates by the system 60 in FIG. 2A. The system 60 includes an AER interconnect module 65 that provides addressing functions for selectively interconnecting the AER element modules 28 and 29 in different networks 50. Each "To AER" element module 28 is connected to a "From AER" element module 29 via the AER interconnect module 65 which provides soft-wiring between the networks 50. The crossbar 12 in each network 50 provides hard-wiring therein.

When a neuron 51 spikes, the neuron 51 communicates the spike signal to a "To AER" module 28 which in turn communicates with a "From AER" module 29. The spike signal is further sent from the spiking neuron 51 back via a dendrite 34 to connected noruens 52. The noruens 52 receive the spike signals as inputs (much like the neurons 51 do), and when each noruen 52 receives sufficient input, the noruen 52 spikes.

As such, there is local propagation of information back from neurons 51 to noruen 52 via dendrites 34. Specifically, there is local forward flow of information because signals from "From AER" modules 29 are communicated to neurons 51 via axons 26 and dendrites 34. Each neuron 51 comprises an integrate and fire neuron which integrates received input signals from "From AER" modules 29, and fires (spikes)

when the integrated input signals exceed a threshold. A spiking signal from a neuron 51 is transmitted to the connected "To AER" module 28. Further, there is local backward flow of information because when a neuron 51 spikes, it also sends a spike signal through dendrites 34 and axons 26 to connected noruen 52. Each noruen integrates input signals from neurons 51 and fires (spikes) when the integrated input signals exceed a threshold. The output signal from a spiking noruen 52 goes back to the neuron 51 that the noruen 52 corresponds to.

According to an embodiment of the invention, the noruens 52 are utilized to achieve structural plasticity via learning rules. Preferably, spiking by the neurons 51 and noruen 52 is balanced, and used to determine whether to soft-rewire axons 26 of the neurons 51. If a neuron 51 spikes and then a noruen 52 spikes, the axonal connections for the current set of axonal targets is acceptable as providing balanced spiking. However, if a noruen 52 spikes and then a neuron 51 spikes, the axonal connections for the current set of axonal targets need to be switched (routed differently), as described below.

Figure 2A:
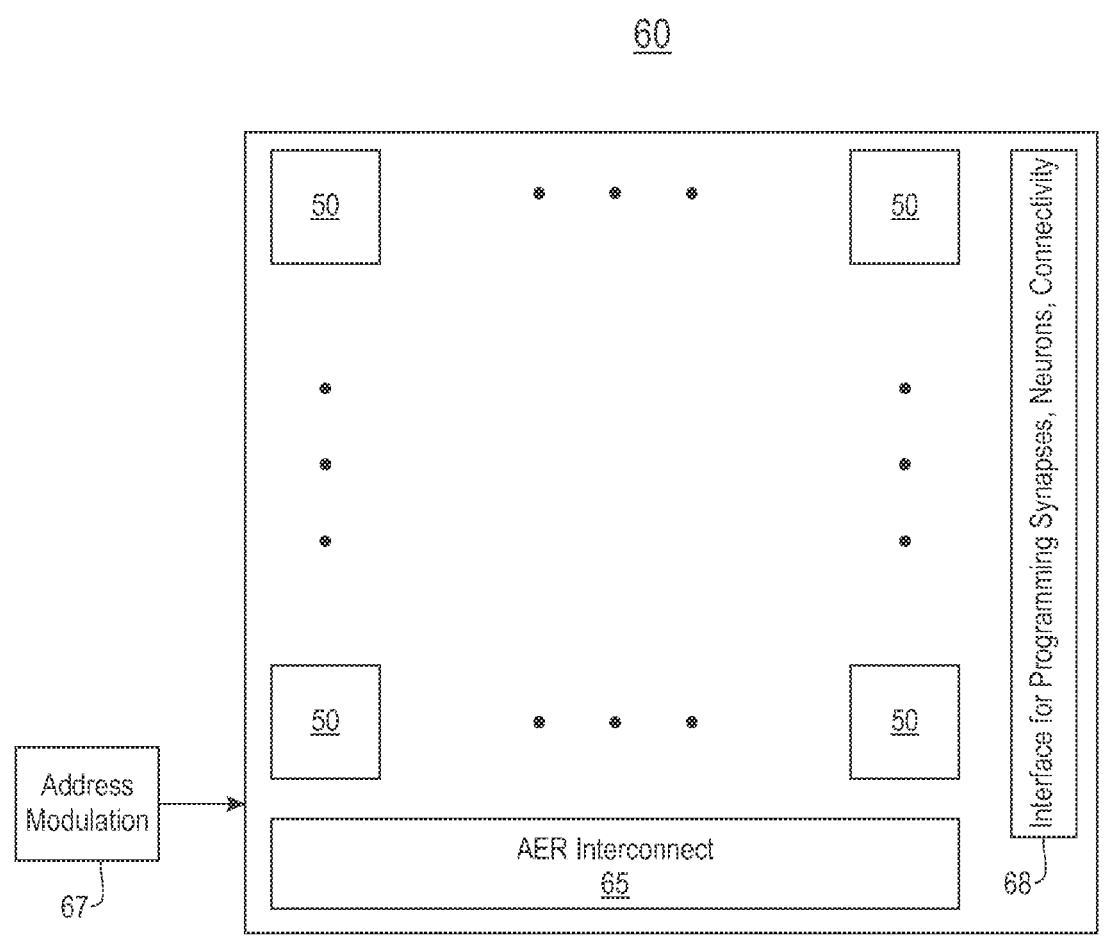
FIG. 2A shows a block diagram of a system of multiple interconnected spiking neural networks of FIG. 1A, according to an embodiment of the invention.

As shown in FIG. 2A, the system 60 includes multiple networks 50 interconnected by an AER interconnect module 65 that provides addressing functions and selectively interconnecting AER element modules 28 and 29 in networks 50. The AER interconnect module 65 selectively interconnects AER element modules 28 and to AER element modules 29 in different networks 50. When a neuron 51 spikes, it has a certain "To AER" address to communicate with. According to an embodiment of the invention, the interconnectivity between AER element modules 28 and 29 may be changed to maintain balance between spiking of neurons 51 and connected noruens 52, as described above. As such, the neuron and noruen addresses themselves are plastic, or adaptive, based on rerouting criteria to achieve said balance. The axonal target addresses (i.e., the "To AER" and the "From AER") are modulated to achieve said balance using an address modulation block 67 that enables selectively changing interconnectivity between AER element modules 28 and 29.

Figure 2B:
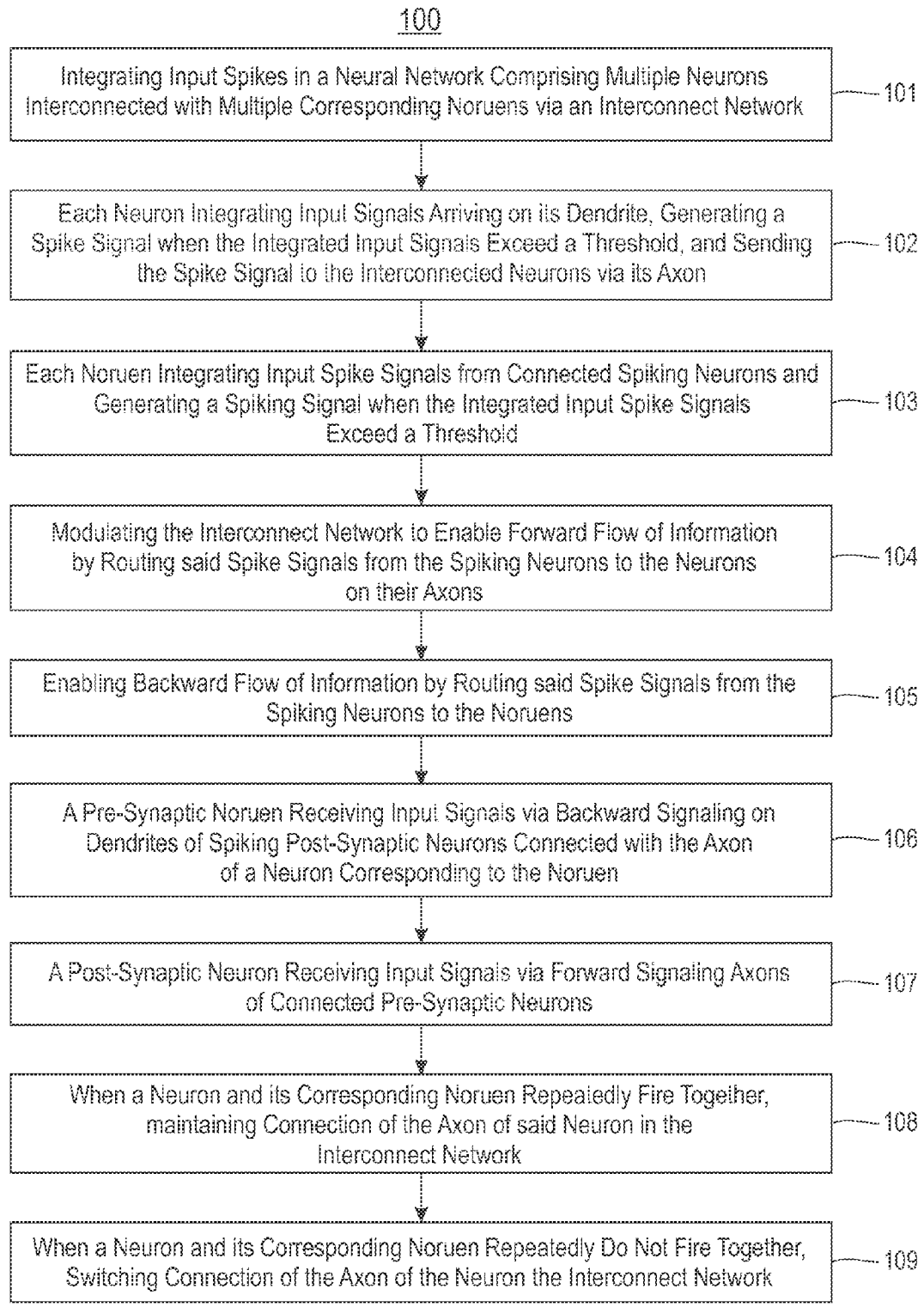
FIG. 2B shows a flowchart of a process for operation of a spiking neural network, according to an embodiment of the invention.

FIG. 2B shows a flowchart of a process 100 for producing structural plasticity in a neural network, such as network 50 in FIG. 1A, according to an embodiment of the invention, comprising the following process blocks:

Process block 101: Integrating input spikes in a neural network comprising multiple neurons interconnected with multiple corresponding noruens via an interconnect network;

Process block 102: Each neuron integrating input signals arriving on its dendrite, generating a spike signal when the integrated input signals exceed a threshold, and sending the spike signal to the interconnected neurons via its axon;

Process block 103: Each noruen integrating input spike signals from connected spiking neurons and generating a spiking signal when the integrated input spike signals exceed a threshold;

Process block 104: Modulating the interconnect network to enable forward flow of information by routing said spike signals from the spiking neurons to the neurons on their axons;

Process block 105: Enabling backward flow of information by routing said spike signals from the spiking neurons to the noruens;

Process block 106: A pre-synaptic noruen receiving input signals via backward signaling on dendrites of spiking post-synaptic neurons connected with the axon of a neuron corresponding to the noruen;

Process block 107: A post-synaptic neuron receiving input signals via forward signaling axons of connected pre-synaptic neurons;

Process block 108: When a neuron and its corresponding noruen repeatedly fire together, maintaining connection of the axon of said neuron in the interconnect network; and Process block 109: When a neuron and its corresponding noruen repeatedly do not fire together, switching connection of the axon of the neuron the interconnect network.

Figure 3:
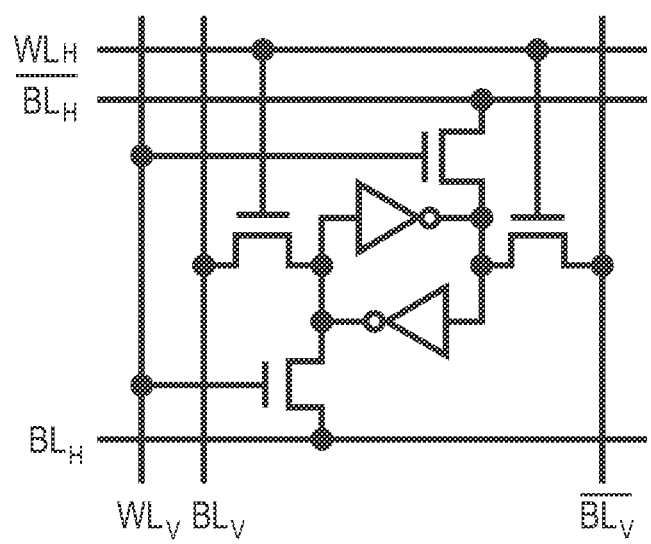
FIG. 3 shows a block diagram of a synapse device for a neural network, according to an embodiment of the invention.

As shown in FIG. 3, in one embodiment, each synapse 31 comprises a symmetric synapse device, such as static random access memory (SRAM) cell, that permits reading and updating synapse weights along axons and dendrites. A transposable cell 31 is utilized for pre-synaptic (row) and post-synaptic (column) synapse updates. $WL_H$ stands for horizontal (axonal) wordlines and $BL_H$ stands for horizontal (axonal) bitlines as for memory arrays. $WL_H$, $BL_H$, $\overline{BL}_H$ (inversion of $BL_H$) are used for axonal updates of the synapse 31, and $WL_V$, $BL_V$, $\overline{BL}_V$ are used for dendritic updates of the synapse 31. The binary synapses 31 may be updated probabilistically (e.g., using random number generators in neurons 51).

In one embodiment, pre-synaptic noruens 52 receive input signals via axons 26 of connected spiking post-synaptic neurons 51. Further, pre-synaptic spiking noruens 52 project spiking signals via dendrites 34 of connected post-synaptic neurons 51.

According to an embodiment of the invention, each synapse 31 has parameters (such as a synaptic weight) that define functional behavior of the synapse 31. As such, synaptic weights for synapses 31 affect the functional behavior of the synapses 31. A spike signal from a neuron 51 creates a voltage bias across a connected synapse 31, resulting in a current flow into downstream neurons 51. The magnitude of that current flow is based on the synaptic weight (conductance) of a synapse 31. The magnitude of the current flow, or other sensing mechanisms, are used to deterministically read the synaptic weight of a synapse 31. In one example, an interface module 68 programs/updates synaptic weights such that each synapse 31 in the crossbar 12 has a synaptic weight that affects (e.g., programs) the functional behavior (e.g., electrical conductivity) of the synapse 31 based on the corresponding synaptic weight (e.g., "0" indicating a synapse 31 is not conducting, "1" indicating the synapse 31 is conducting).

Embodiments of the invention further provide reinforcement learning. Reinforcement learning (RL) generally comprises learning based on consequences of actions, wherein an RL module selects actions based on past events. A reinforcement signal received by the RL module is a reward (e.g., a numerical value) which indicates the success of an action. The RL module then learns to select actions that increase the rewards over time.

In another embodiment the present invention provides a neural system, comprising a neuron network of multiple neurons interconnected via a forward interconnect network including a plurality of synapses. Each neuron: integrates input signals arriving on its dendrite, generates a spike signal when the integrated input signals exceed a threshold, and sends the spike signal to the interconnected neurons via its axon. The system further includes a noruen network comprising multiple noruens connected to the neuron network via the interconnect network, one noruen for every corresponding neuron, wherein each noruen comprises a symmetric dual of a neuron. For a first neuron that is connected via its axon through a synapse to dendrite of a second neuron, a noruen corresponding to the second neuron is connected via its axon through the same synapse to dendrite of the noruen corresponding to the first neuron. Each noruen integrating input spike signals from connected spiking neurons and generating a spiking signal when the integrated input spike signals exceed a threshold.

In one embodiment, a set of neurons are designated as input neurons and a set of neurons are designated as output neurons. Input-to-output processing is carried out by the neuron network and the output-to-input processing is carried out by the noruen network. A synaptic learning in the system is a function of the activity in the neuron network and the noruen network. The synaptic learning strives to maximize agreement between spiking of every neuron and its corresponding noruen. The synaptic learning strives to maximize disagreement between spiking of every neuron and its corresponding noruen.

In one embodiment, a set of neurons are designated for feedback, such that whenever a feedback neuron spikes the corresponding noruen is made to spike. Input neurons are presented with input patterns and noruens corresponding to output neurons are presented with desired output patterns. When a neuron and a corresponding noruen spike together repeatedly, the synapses that contribute to their spiking are strengthened. When a neuron and a corresponding noruen spiking repeatedly disagree, the synapses that contribute to their spiking are weakened.

In one embodiment, input neurons are presented with the input patterns and noruens corresponding to output neurons are presented with undesired output patterns. When a neuron and a corresponding noruen spike together repeatedly, the synapses that contribute to their spiking are weakened.

Figure 4:
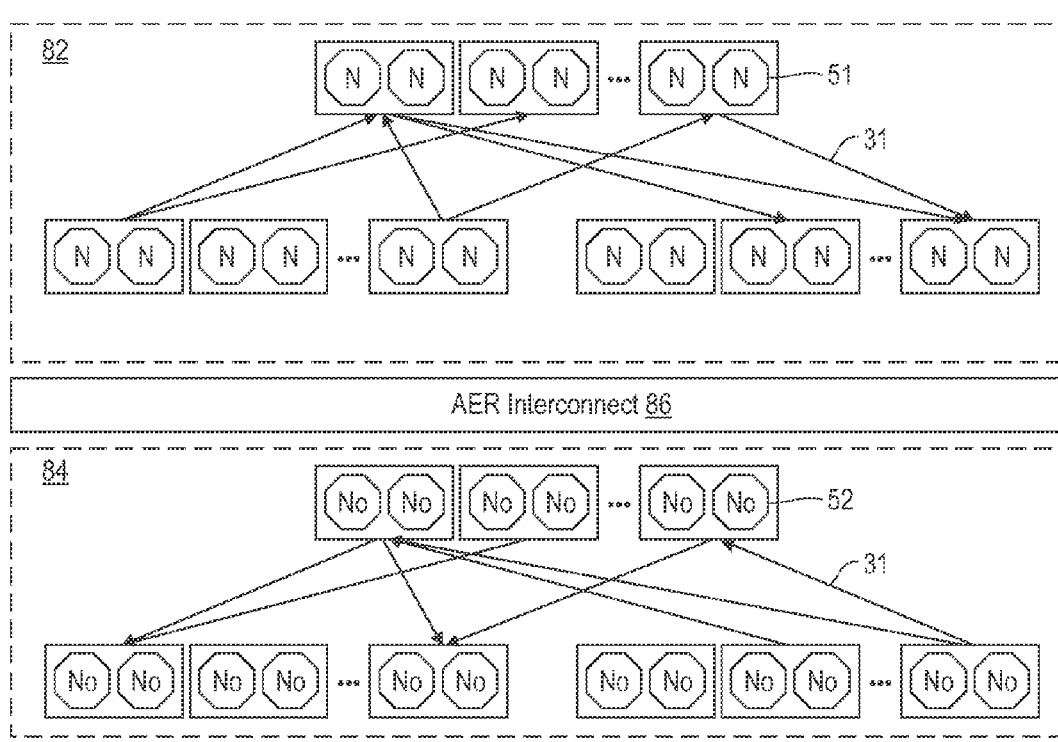
FIG. 4 shows a block diagram of a system of multiple interconnected electronic neurons and symmetric duals of electronic neurons with reinforcement learning, according to an embodiment of the invention.

A spiking neuron network can be modeled as a directed graph comprising a collection of vertices and edges, wherein a directed graph has directional edges. As shown by example system 80 in FIG. 4, in a neuron network 82 spiking neurons 51 are vertices and synapses 31 are weighted directed edges. In one implementation, the neurons 51 are interconnected via a crossbar (such as crossbar 12 in FIG. 1A). According to an embodiment of the invention, a spiking noruen network 84 comprises multiple noruens 52. In one implementation, the noruens 52 are interconnected via a crossbar (such as crossbar 12 in FIG. 1A). Given a neuron network 82, an associated noruen network 84 is formed by replacing each neuron by a noruen, and reversing directionality of each synapse (in terms of signal transmitting direction) but keeping the synaptic weight. In one embodiment, an AER interconnect module connects the networks 82 and 84.

According to an embodiment of the invention, the synaptic weights are updated according to learning rules using an interface module. There is no learning in a spiking neuron network (i.e., synaptic weights in the spiking neuron network are not updated). The neuron network interacts with other modules and receives spikes. If a spike due to a desirable event (positive event) occurs, then a set of neurons 51 in the neuron network 82 that are responsible for the spiking are identified. A short time window (e.g., about 10 ms to about 100 ms) is selected, wherein whenever one of the identified neurons 51 spikes, its associated noruen 52 is also caused to spike by simply declaring that it has spiked. Spike signal of a noruen 52 then propagates along the spiking noruen network 84 (e.g., via connected axons/dendrites and synapses). A learning rule (such as STDP) is applied in the spiking noruen network 84 to update synaptic weights therein via the interface module 68. The learned weights are then used in the spiking neuron network 82 because the same set of weights are used in neuron and noruen networks, (this is automatic).

If a spike due to an undesirable event (negative event) occurs, then a set of neurons 51 in the neuron network 82 that are responsible for the undesirable event are identified. A short time window is selected, wherein whenever one of the identified neurons 51 spikes, its associated noruen 52 also spikes. Spike signal of a noruen 52 then propagates along the spiking noruen network 84 (e.g., via connected axons/dendrites and synapses), a learning rule (such as anti-STDP) is applied to update synaptic weights in the spiking noruen network 84. The learned weights are then used in the spiking neuron network 82. The desirable and undesirable scenarios are similar except that different learning rules are applied for updating the synaptic weights in the network 84.

Whenever a desirable event occurs, spiking along the noruen network implicitly determines causal synaptic links that may have caused the associated neurons to spike and updates the synaptic weights to strengthen the involved synaptic links. Whenever an undesirable event occurs, spiking along the noruen network implicitly determines causal synaptic links that may have caused the associated neurons to spike and updates the synaptic weights to weaken the involved synaptic links.

Figure 5A:
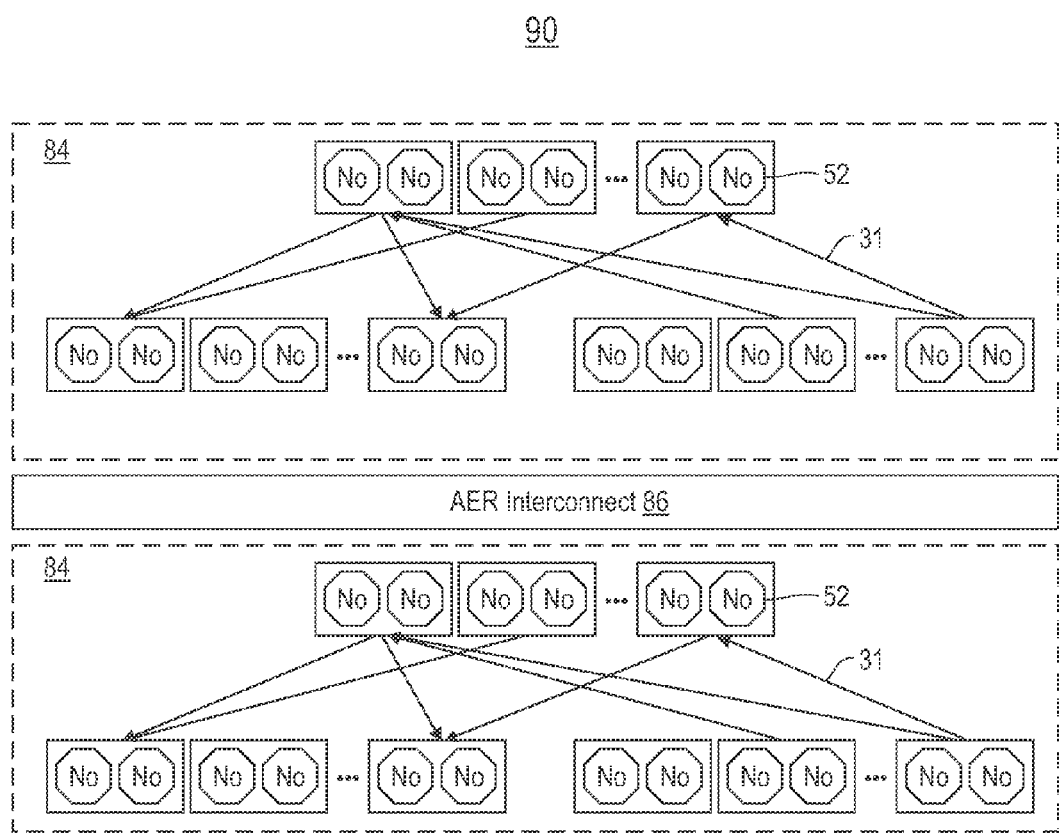
FIG. 5A shows a block diagram of a system of multiple interconnected symmetric duals of electronic neurons reinforcement learning, according to an embodiment of the invention.

Referring to FIG. 5A, in another embodiment, two noruen networks 84 are utilized in a neural system 90, wherein spiking signals indicating desirable outcomes propagate in one noruen network, and spiking signals indicating undesirable outcomes propagate in the other noruen network. In one embodiment, if desirable and undesirable spiking signal phases overlap then desirable (reward) spiking signals are propagated on the desirable event noruen network (with STDP), and undesirable spiking signals are propagated on the undesirable event noruen network (with anti-STDP).

Figure 5B:
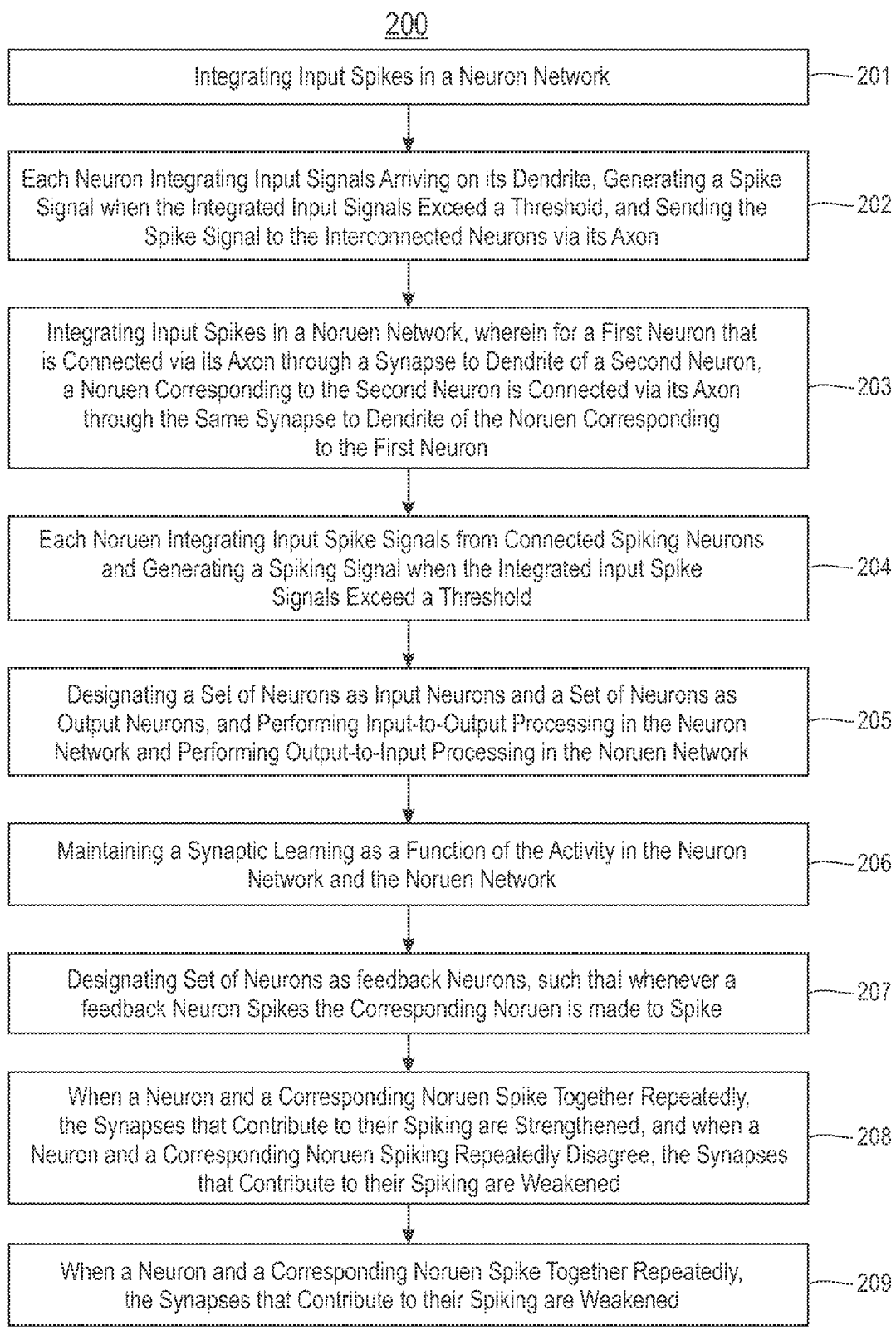
FIG. 5B shows a flowchart of a process for operation of a spiking neural network, according to an embodiment of the invention.

FIG. 5B shows a flowchart of a process 200 for producing structural plasticity in a neural network, according to an embodiment of the invention, comprising the following process blocks:

Process block 201: Integrating input spikes in a neuron network;

Process block 202: Each neuron integrating input signals arriving on its dendrite, generating a spike signal when the integrated input signals exceed a threshold, and sending the spike signal to the interconnected neurons via its axon;

Process block 203: Integrating input spikes in a noruen network, wherein for a first neuron that is connected via its axon through a synapse to dendrite of a second neuron, a noruen corresponding to the second neuron is connected via its axon through the same synapse to dendrite of the noruen corresponding to the first neuron;

Process block 204: Each noruen integrating input spike signals from connected spiking neurons and generating a spiking signal when the integrated input spike signals exceed a threshold;

Process block 205: Designating a set of neurons as input neurons and a set of neurons as output neurons, and performing input-to-output processing in the neuron network and performing output-to-input processing in the noruen network;

Process block 206: Maintaining a synaptic learning as a function of the activity in the neuron network and the noruen network. In one example, synaptic learning strives to maximize agreement between spiking of every neuron and its corresponding noruen. In another example, the synaptic learning strives to maximize disagreement between spiking of every neuron and its corresponding noruen;

Process block 207: Designating set of neurons as feedback neurons, such that whenever a feedback neuron spikes the corresponding noruen is made to spike;

Process block 208: When a neuron and a corresponding noruen spike together repeatedly, the synapses that contribute to their spiking are strengthened, and when a neuron and a corresponding noruen spiking repeatedly disagree, the synapses that contribute to their spiking are weakened; and Process block 209: When a neuron and a corresponding noruen spike together repeatedly, the synapses that contribute to their spiking are weakened.

The term neuron device (electronic neuron) as used herein represents an architecture configured to simulate a biological neuron. An electronic neuron creates connections between processing elements that are roughly functionally equivalent to neurons of a biological brain. As such, a neuromorphic and synaptronic system comprising electronic neurons according to embodiments of the invention may include various electronic circuits that are modeled on biological neurons. Further, a neuromorphic and synaptronic system comprising electronic neurons according to embodiments of the invention may include various processing elements (including computer simulations) that are modeled on biological neurons. Although certain illustrative embodiments of the invention are described herein using electronic neurons comprising electronic circuits, the present invention is not limited to electronic circuits. A neuromorphic and synaptronic system according to embodiments of the invention can be implemented as a neuromorphic and synaptronic architecture comprising circuitry, and additionally as a computer simulation. Indeed, embodiments of the invention can take the form of an entirely hardware embodiment, an entirely software embodiment or an embodiment containing both hardware and software elements. The terms noruen device (electronic noruen) and synapse device (electronic synapse) may also be implemented as described above.

Figure 6:
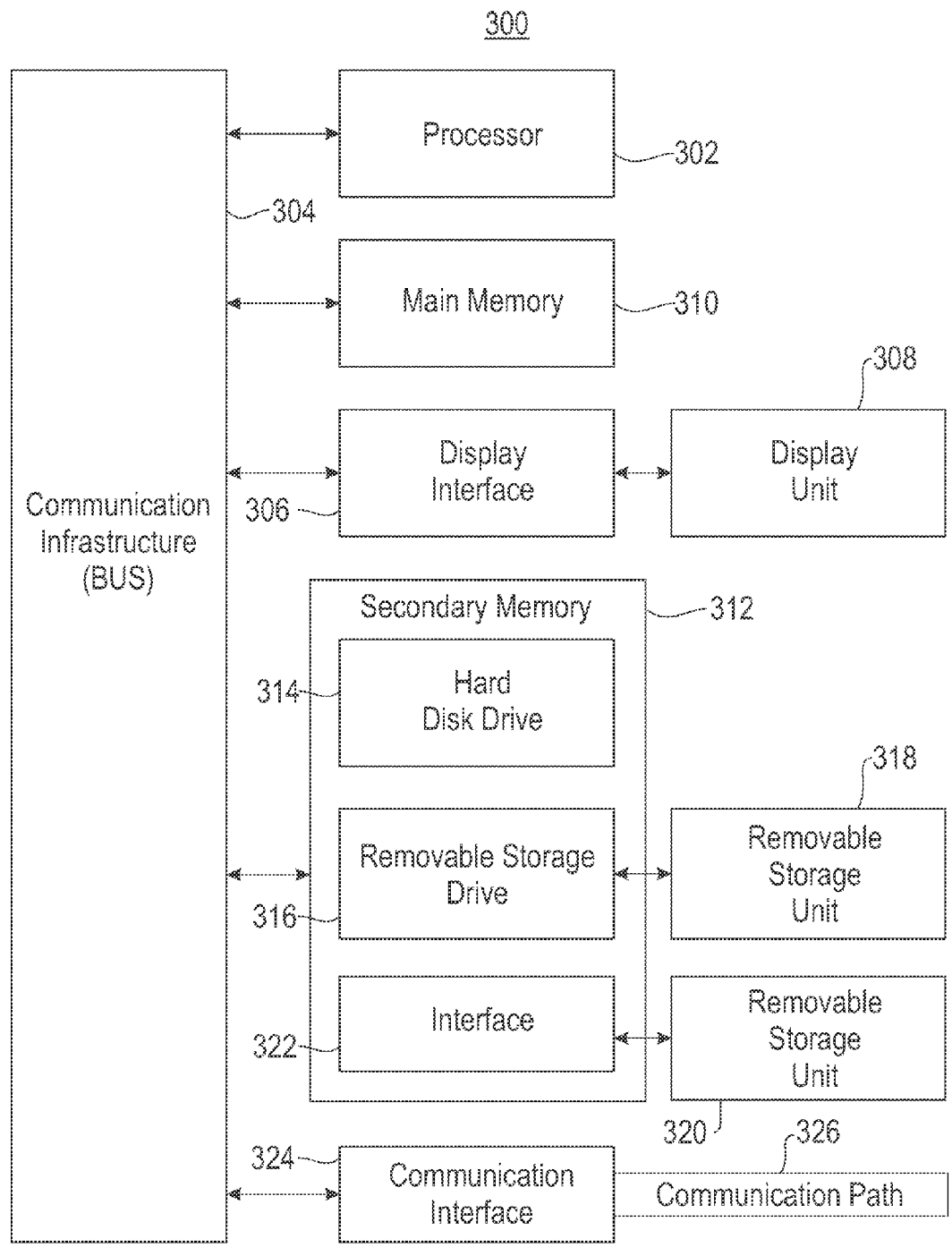
FIG. 6 shows a high level block diagram of an information processing system useful for implementing one embodiment of the present invention.

FIG. 6 is a high level block diagram showing an information processing system 300 useful for implementing one embodiment of the present invention. The computer system includes one or more processors, such as processor 302. The processor 302 is connected to a communication infrastructure 304 (e.g., a communications bus, cross-over bar, or network).

The computer system can include a display interface 306 that forwards graphics, text, and other data from the communication infrastructure 304 (or from a frame buffer not shown) for display on a display unit 308. The computer system also includes a main memory 310, preferably random access memory (RAM), and may also include a secondary memory 312. The secondary memory 312 may include, for example, a hard disk drive 314 and/or a removable storage drive 316, representing, for example, a floppy disk drive, a magnetic tape drive, or an optical disk drive. The removable storage drive 316 reads from and/or writes to a removable storage unit 318 in a manner well known to those having ordinary skill in the art. Removable storage unit 318 represents, for example, a floppy disk, a compact disc, a magnetic tape, or an optical disk, etc. which is read by and written to by removable storage drive 316. As will be appreciated, the removable storage unit 318 includes a computer readable medium having stored therein computer software and/or data.

In alternative embodiments, the secondary memory 312 may include other similar means for allowing computer programs or other instructions to be loaded into the computer system. Such means may include, for example, a removable storage unit 320 and an interface 322. Examples of such means may include a program package and package interface (such as that found in video game devices), a removable memory chip (such as an EPROM, or PROM) and associated socket, and other removable storage units 320 and interfaces 322 which allow software and data to be transferred from the removable storage unit 320 to the computer system.

The computer system may also include a communication interface 324. Communication interface 324 allows software and data to be transferred between the computer system and external devices. Examples of communication interface 324 may include a modem, a network interface (such as an Ethernet card), a communication port, or a PCMCIA slot and card, etc. Software and data transferred via communication interface 324 are in the form of signals which may be, for example, electronic, electromagnetic, optical, or other signals capable of being received by communication interface 324. These signals are provided to communication interface 324 via a communication path (i.e., channel) 326. This communication path 326 carries signals and may be implemented using wire or cable, fiber optics, a phone line, a cellular phone link, an RF link, and/or other communication channels.

In this document, the terms "computer program medium," "computer usable medium," and "computer readable medium" are used to generally refer to media such as main memory 310 and secondary memory 312, removable storage drive 316, and a hard disk installed in hard disk drive 314.

Computer programs (also called computer control logic) are stored in main memory 310 and/or secondary memory 312. Computer programs may also be received via communication interface 324. Such computer programs, when run, enable the computer system to perform the features of the present invention as discussed herein. In particular, the computer programs, when run, enable the processor 302 to perform the features of the computer system. Accordingly, such computer programs represent controllers of the computer system.

From the above description, it can be seen that the present invention provides a system, computer program product, and method for implementing the embodiments of the invention. References in the claims to an element in the singular is not intended to mean "one and only" unless explicitly so stated, but rather "one or more." All structural and functional equivalents to the elements of the above-described exemplary embodiment that are currently known or later come to be known to those of ordinary skill in the art are intended to be encompassed by the present claims. No claim element herein is to be construed under the provisions of 35 U.S.C. section 112, sixth paragraph, unless the element is expressly recited using the phrase "means for" or "step for."

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for reinforcement learning, the method comprising:
   in a neural network comprising multiple neurons and multiple noruens interconnected by multiple synapse devices:
      receiving a reinforcement signal resulting from a neuron and a noruen of the neural network spiking together, wherein the noruen comprises a symmetric dual of the neuron, the neuron and the noruen spike together repeatedly, the reinforcement signal corresponds to an event involving an action, and the reinforcement signal represents a reward indicating success of the action; and
      determining at least one synapse device of the multiple synapse devices contributing to the spiking of the neuron and the noruen; and
      selectively updating synaptic weights of the multiple synapse devices to strengthen the at least one synapse device determined, wherein the updated synaptic weights allows selection of at least one action that increases rewards over time.

2. The method of claim 1, further comprising:
   selectively updating the synaptic weights of the multiple synapse devices to strengthen the at least one synapse device determined based on a first learning rule.

3. The method of claim 2, wherein the first learning rule implements spike-timing dependent plasticity (STDP).

4. The method of claim 1, further comprising:
   determining whether spike signals from the neuron and the noruen represent occurrence of a desirable event; and
   strengthening at least one synapse device contributing to the neuron and the noruen outputting the spike signals.

5. The method of claim 1, further comprising:
   determining whether spike signals from the neuron and the noruen represent occurrence of an undesirable event; and
   weakening at least one synapse device contributing to the neuron and the noruen outputting the spike signals.

6. The method of claim 2, further comprising:
   selectively updating the synaptic weights of the multiple synapse devices to weaken at least one synapse device of the multiple synapse devices based on a second learning rule.

7. The method of claim 6, wherein the second learning rule implements anti-STDP.

8. A system comprising a computer processor, a computer-readable hardware storage device, and program code embodied with the computer-readable hardware storage device for execution by the computer processor to implement a method for reinforcement learning, the method comprising:
   in a neural network comprising multiple neurons and multiple noruens interconnected by multiple synapse devices:
      receiving a reinforcement signal resulting from a neuron and a noruen of the neural network spiking together, wherein the noruen comprises a symmetric dual of the neuron, the neuron and the noruen spike together repeatedly, the reinforcement signal corresponds to an event involving an action, and the reinforcement signal represents a reward indicating success of the action; and
      determining at least one synapse device of the multiple synapse devices contributing to the spiking of the neuron and the noruen; and
      selectively updating synaptic weights of the multiple synapse devices to strengthen the at least one synapse device determined, wherein the updated synaptic weights allows selection of at least one action that increases rewards over time.

9. The system of claim 8, the method further comprising:
   selectively updating the synaptic weights of the multiple synapse devices to strengthen the at least one synapse device determined based on a first learning rule.

10. The system of claim 9, wherein the first learning rule implements spike-timing dependent plasticity (STDP).

11. The system of claim 8, the method further comprising:
    determining whether spike signals from the neuron and the noruen represent occurrence of a desirable event; and
    strengthening at least one synapse device contributing to the neuron and the noruen outputting the spike signals.

12. The system of claim 10, the method further comprising:
    determining whether spike signals from the neuron and the noruen represent occurrence of an undesirable event; and
    weakening at least one synapse device contributing to the neuron and the noruen outputting the spike signals.

13. The system of claim 9, the method further comprising:
    selectively updating the synaptic weights of the multiple synapse devices to weaken at least one synapse device of the multiple synapse devices based on a second learning rule.

14. The system of claim 13, wherein the second learning rule implements anti-STDP.

15. A computer program product comprising a computer-readable hardware storage device having program code embodied therewith, the program code being executable by a computer to implement a method for reinforcement learning, the method comprising:
    in a neural network comprising multiple neurons and multiple noruens interconnected by multiple synapse devices:
       receiving a reinforcement signal resulting from a neuron and a noruen of the neural network spiking together, wherein the noruen comprises a symmetric dual of the neuron, the neuron and the noruen spike together repeatedly, the reinforcement signal corresponds to an event involving an action, and the reinforcement signal represents a reward indicating success of the action; and determining at least one synapse device of the multiple synapse devices contributing to the spiking of the neuron and the noruen; and selectively updating synaptic weights of the multiple synapse devices to strengthen the at least one synapse device determined, wherein the updated synaptic weights allows selection of at least one action that increases rewards over time.

16. The computer program product of claim 15, the method further comprising:

selectively updating the synaptic weights of the multiple synapse devices to strengthen the at least one synapse device determined based on a first learning rule.

17. The computer program product of claim 16, wherein the first learning rule implements spike-timing dependent plasticity (STDP).

18. The computer program product of claim 15, the method further comprising:

determining whether spike signals from the neuron and the noruen represent occurrence of a desirable event; and strengthening at least one synapse device contributing to the neuron and the noruen outputting the spike signals.

19. The computer program product of claim 15, the method further comprising:

determining whether spike signals from the neuron and the noruen represent occurrence of an undesirable event; and weakening at least one synapse device contributing to the neuron and the noruen outputting the spike signals.

20. The computer program product of claim 16, the method further comprising:

selectively updating the synaptic weights of the multiple synapse devices to weaken at least one synapse device of the multiple synapse devices based on a second learning rule, wherein the second learning rule implements anti-STDP.

\* \* \* \* \*